(12) United States Patent
Eriksson

(10) Patent No.: US 7,251,271 B1
(45) Date of Patent: Jul. 31, 2007

(54) DIGITAL FILTER DESIGN

(75) Inventor: Anders Eriksson, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1315 days.

(21) Appl. No.: 09/655,755

(22) Filed: Sep. 6, 2000

(30) Foreign Application Priority Data

Sep. 7, 1999 (SE) .................................. 9903161

(51) Int. Cl.
*H04H 7/40* (2006.01)

(52) U.S. Cl. ...................... 375/229; 375/346; 708/313

(58) Field of Classification Search .............. 375/229, 375/219, 346, 222, 235, 232, 260, 295, 316; 367/135; 381/93, 314, 94.1, 94.2, 74, 312, 381/316; 455/570; 708/313, 321, 420, 300, 708/301; 370/286, 289, 484; 379/406.01, 379/406.05, 406.11–406.13; 700/315, 400, 700/402, 403–405; 84/621–625; 341/126, 341/138

See application file for complete search history.

(56) References Cited

U.S. PATENT DOCUMENTS

| | | | | |
|---|---|---|---|---|
| 4,547,889 A | * | 10/1985 | Picchi et al. ................ | 375/235 |
| 4,636,972 A | * | 1/1987 | Boland ....................... | 708/321 |
| 5,202,900 A | * | 4/1993 | Leitch ........................ | 375/278 |
| 5,227,990 A | | 7/1993 | Vaupel et al. | |
| 5,337,264 A | * | 8/1994 | Levien ....................... | 708/300 |
| 5,548,286 A | * | 8/1996 | Craven ....................... | 341/126 |
| 5,606,575 A | * | 2/1997 | Williams ..................... | 375/219 |
| 5,686,683 A | * | 11/1997 | Freed .......................... | 84/625 |
| 5,809,069 A | | 9/1998 | Polley et al. | |
| 6,236,731 B1 | * | 5/2001 | Brennan et al. ............. | 381/316 |
| 6,459,914 B1 | * | 10/2002 | Gustafsson et al. .......... | 455/570 |

FOREIGN PATENT DOCUMENTS

| | | |
|---|---|---|
| EP | 0518580 | 6/1992 |
| EP | 0820174 | 1/1998 |

OTHER PUBLICATIONS

J.S. Lim and O.V. Oppenheim, "Enhancement and bandwidth compression of noisy speech", Proc. of the IEEE, vol. 67, No. 12, 1979, pp. 1586-1604.

S.F. Boll, "Suppression of acoustic noise in speech using spectral subtraction", IEEE Trans. on Acoustics, Speech and Signal Processing, vol. ASSP-27, No. 2, 1979, pp. 113-120.

L.R. Rabiner and B. Gold, "Theory and application of digital signal processing", Prentice Hall, Englewood Cliffs, NJ., 1975, pp. 59-67.

(Continued)

*Primary Examiner*—Dac V. Ha
(74) *Attorney, Agent, or Firm*—Roger S. Burleigh

(57) ABSTRACT

Method and apparatus for designing digital filters are provided. One method includes the steps of determining a real-valued discrete-frequency representation of a desired digital filter and transforming this discrete-frequency representation into a corresponding discrete-time representation. The discrete-time representation is circularly shifted and a window is applied to the discrete time representation to produce a zero-padded reduced length filter. Thereafter input signal x[n] is convolved with the reduced length filter.

22 Claims, 5 Drawing Sheets

OTHER PUBLICATIONS

H. Gustafsson et al., "Spectral subtraction using correct convolution and a spectrum dependent exponential averaging method", Research Report 15/98, Department of Signal Processing, University of Karlskrona/Ronneby, Sweden, 1998.

A.V. Oppenheim and R.V. Schafer, "Discrete-time signal processing", Prentice Hall, Engelwood Cliffs, NJ., 1989, pp. 447-456.

T. Sodererstrom and P. Stoica, "System Identification", Prentice Hall International, London, U.K., 1989, pp. 172-182.

* cited by examiner

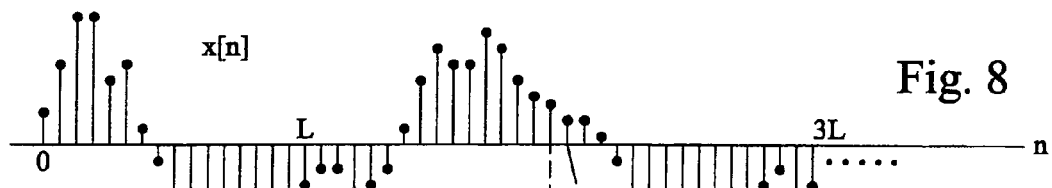
Fig. 8
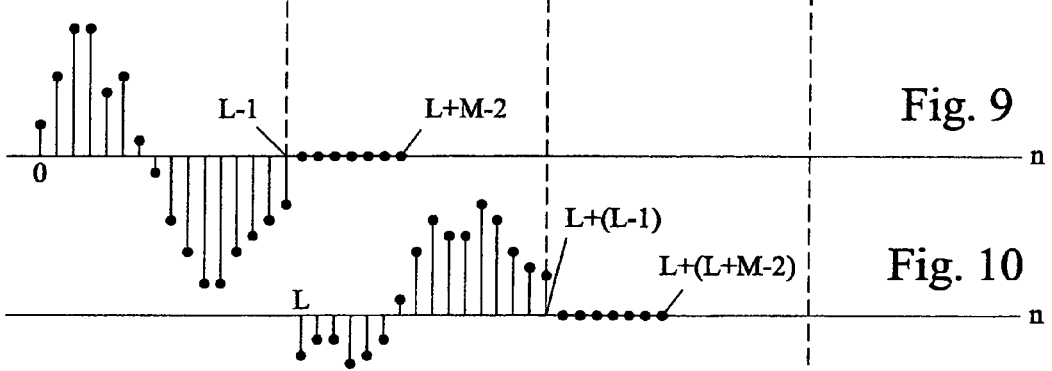
Fig. 9
Fig. 10
Fig. 11
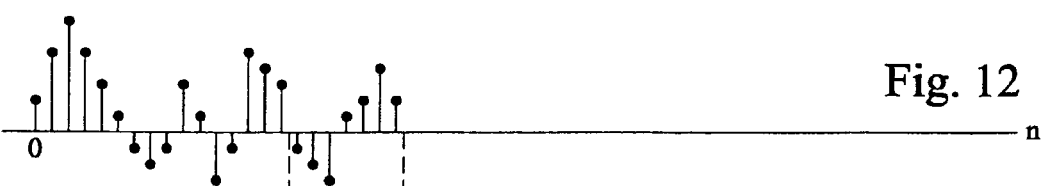
Fig. 12
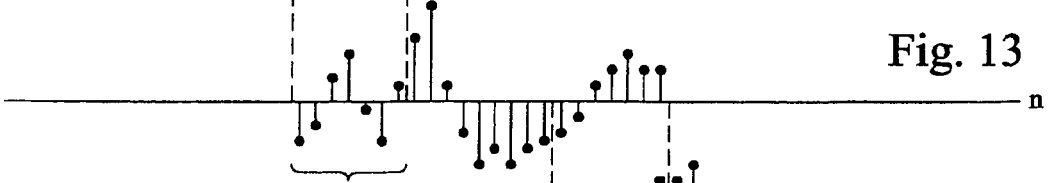
Fig. 13
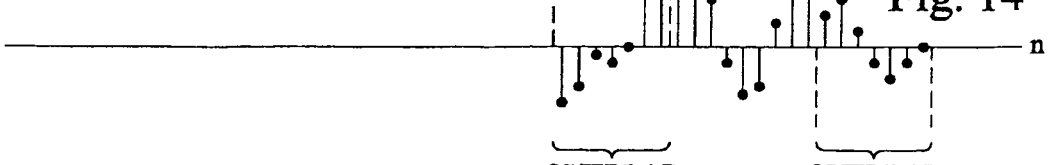
Fig. 14

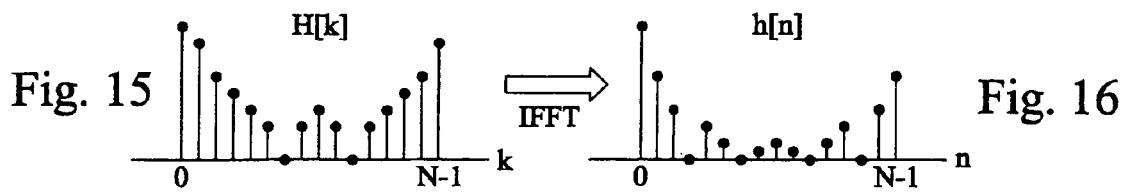
Fig. 15  Fig. 16
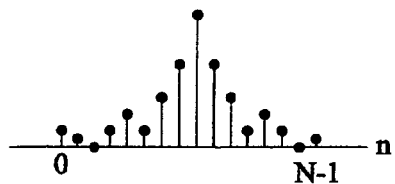
Fig. 17
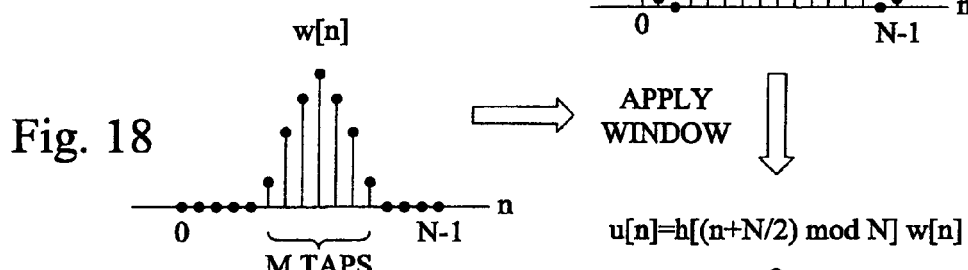
Fig. 18  Fig. 19
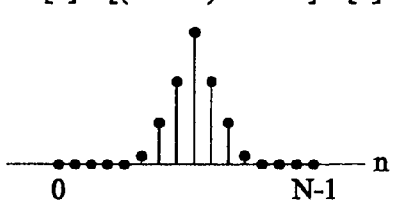
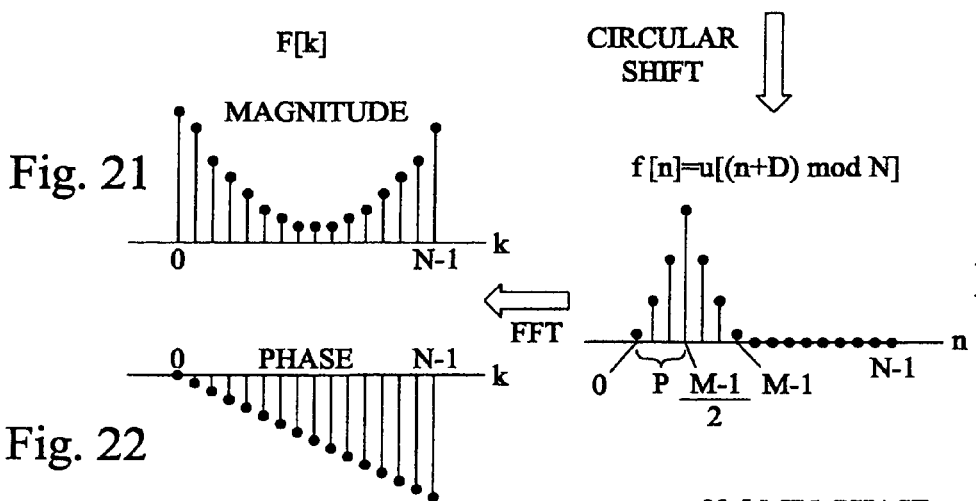
Fig. 21  Fig. 20
Fig. 22
Fig. 23

DIGITAL FILTER DESIGN

BACKGROUND

The present invention relates to digital filtering, and in particular to digital filter design.

Some digital signal processing algorithms are based on filter design in the frequency domain. Typical applications are noise suppression algorithms for speech enhancement (see [1, 2]) and non-linear processors for echo cancellation. These filters are often quite long, which means that it may be desirable to perform the convolution (filtering) in the frequency domain, since this is less complex than convolution in the time domain. Since the input signal to be filtered is typically much longer than the filter, the desired linear convolution has to be implemented by circular sectioned or block convolution (see [3]) in order to avoid unacceptable delays and/or complexity.

A problem with filters designed in the frequency domain is that they are real-valued, which leads to a time domain representation in which the peak of the filter is split between the beginning and end of the filter (this is equivalent to a filter that is symmetric around lag 0, i.e. an non-causal filter). This makes the filter unsuitable for circular block convolution, since such a filter will generate temporal aliasing. This problem may be mitigated (but not eliminated) by weighting the data with a window that spans more than one block (see [2]). However, this will introduce a delay of 1 block, which is undesirable. The split peak also makes the filter unsuitable for time domain convolution, since the important parts of the filter are at the beginning and end of the filter. This makes it difficult to approximate the filter with a shorter filter to reduce the complexity of the time domain convolution.

Reference [4] describes a method that starts with an initial reduced length discrete frequency filter response (using either the Barlett or Welch method). The reduced length filter response is transformed to the time domain using a reduced length IDFT, circularly shifted to obtain a linear phase filter, zero-padded to obtain an extended length to avoid temporal aliasing, and transformed back to the frequency domain using an extended length DFT. A drawback of this method is that the resolution in frequency is reduced due to the initial reduced length filter.

SUMMARY

An object of the present invention is to provide a filter design method that avoids both temporal aliasing and the delay generated by multi-block windowing with improved frequency resolution.

This object is achieved in accordance with the attached claims.

Briefly, the present invention circularly shifts the filter in the time domain to recenter the filter peak and applies a short window around the peak to extract the essential part of the filter and automatically obtain zero-padding. This method has several advantages:

1. The resulting zero-padded reduced length linear phase filter may be used to implement circular block convolution without temporal aliasing.
2. If the window is sufficiently short, the convolution may also be performed in the time domain.
3. If desired, the obtained linear phase filter may be transformed into a minimum phase filter to reduce the algorithmic processing delay.

BRIEF DESCRIPTION OF THE DRAWINGS

The invention, together with further objects and advantages thereof, may best be understood by making reference to the following description taken together with the accompanying drawings, in which:

FIG. 8 is a time diagram of a longer sample sequence x[n];

FIG. 9 is a time diagram of a first zero-padded block of sample sequence x[n] in FIG. 8 padded with zeroes;

FIG. 10 is a time diagram of a second zero-padded block of sample sequence x[n] in FIG. 8;

FIG. 11 is a time diagram of a third zero-padded block of sample sequence x[n] in FIG. 8;

FIG. 12 is a time diagram of a diagram of the convolution between said first block in FIG. 9 and the zero-padded filter impulse response in FIG. 7;

FIG. 13 is a time diagram of a diagram of the convolution between said second block in FIG. 10 and the zero-padded filter impulse response in FIG. 7;

FIG. 14 is a time diagram of a diagram of the convolution between said third block in FIG. 11 and the zero-padded filter impulse response in FIG. 7;

FIG. 15 is a frequency diagram illustrating a real-valued filter transfer function H[k];

FIG. 16 is a time diagram of the filter impulse response h[n] that is obtained after transforming the transfer function in FIG. 15 to the time domain;

FIG. 17 is a time diagram of the filter impulse response of FIG. 16 after a circular shift of N/2 samples;

FIG. 18 is a time diagram illustrating a time window w[n];

FIG. 19 is a time diagram of the filter impulse response in FIG. 17 after multiplication by the window in FIG. 18;

FIG. 20 is a time diagram of the filter impulse response of FIG. 19 after a circular shift to remove leading zeroes;

FIG. 21 is a frequency diagram of the magnitude of the filter transfer function F[k] that is obtained after transforming the filter impulse response of FIG. 20 to the frequency domain;

FIG. 22 is a frequency diagram of the phase of the filter transfer function F[k] that is obtained after transforming the filter impulse response of FIG. 20 to the frequency domain;

FIG. 23 is a time diagram of the filter impulse response of FIG. 20 after transformation to a minimum phase filter;

DETAILED DESCRIPTION

Since the concepts linear and circular convolution are essential for the present invention, these concepts will be described in more detail with reference to FIGS. 1–14.

Figure 1:
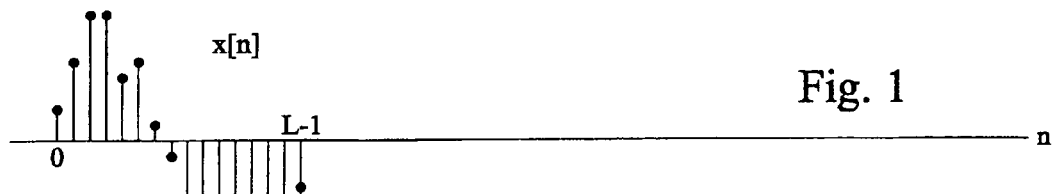
FIG. 1 is a time diagram illustrating a sample sequence x[n]

FIG. 1 is a time diagram illustrating a short sample sequence x[n] of length L. This sequence is to be convolved with a filter having an impulse response h[n] illustrated in FIG. 2. The definition of linear convolution in the time-domain is (assuming a linear time-invariant system):

$$y[n] = x[n] \otimes h[n] = \sum_{k=-\infty}^{\infty} x[k]h[n-k] = \text{in this case} = \sum_{k=0}^{L-1} x[k]h[n-k]$$

Figure 2:
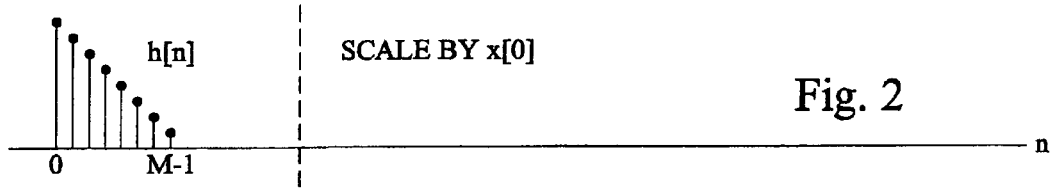
FIG. 2 is a time diagram illustrating a filter impulse response h[n]
Figure 3:
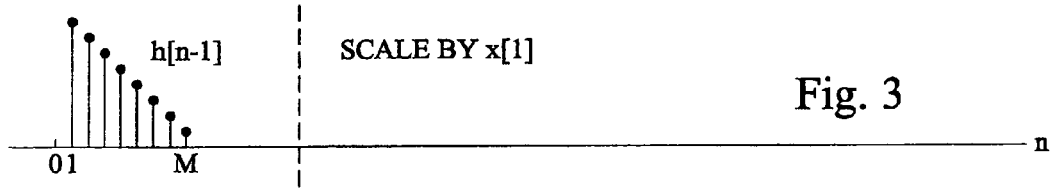
FIG. 3 is a time diagram illustrating a time shifted filter impulse response h[n−1]
Figure 4:
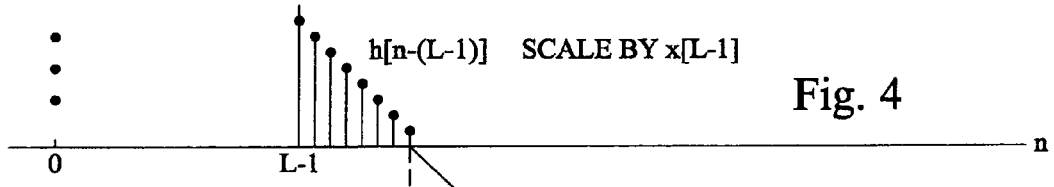
FIG. 4 is a time diagram illustrating a time shifted filter impulse response h[n−L]

This expression may be interpreted in the following way:
1. Form a set of shifted sequences {h[n], h[n−1], . . . , h[n−(L−1)]} as illustrated in FIGS. 2–4.
2. Multiply each sequence by a corresponding sample x[0], x[1], . . . , x[L−1] of sequence x[n].
3. Add the scaled sequences to form the convolution as illustrated in FIG. 5.

Figure 5:
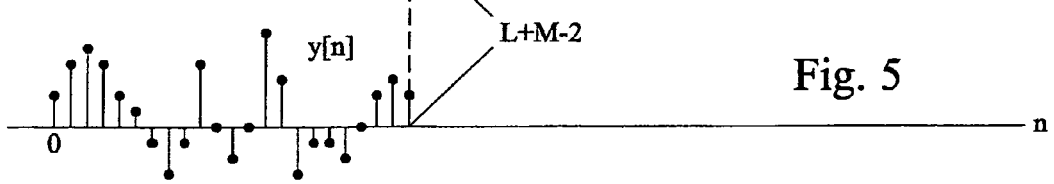
FIG. 5 is a time diagram illustrating the convolution of sample sequence x[n] and filter impulse response h[n]

From the above description and from FIG. 5 it is clear that the resulting convolution y[n] will have a length of L+M−1 samples. Thus, the filtered sequence y[n] will be longer than the original sequence x[n], which has only L samples.

In the above description it was assumed that the convolution was performed in the time domain. However, it is also possible to perform convolution in the frequency domain by transforming each of the sequences x[n], h[n] to the frequency domain using the Discrete Fourier Transform, DFT (typically implemented by the Fast Fourier Transform, FFT), multiply the corresponding transforms with each other and perform an Inverse Discrete Fourier Transform, IDFT (typically implemented by the Inverse Fast Fourier Transform, IFFT), back to the time domain to obtain y[n]. Thus, in the frequency domain the convolution may be expressed as:

Y[k]=X[k]H[k]

Figure 6:
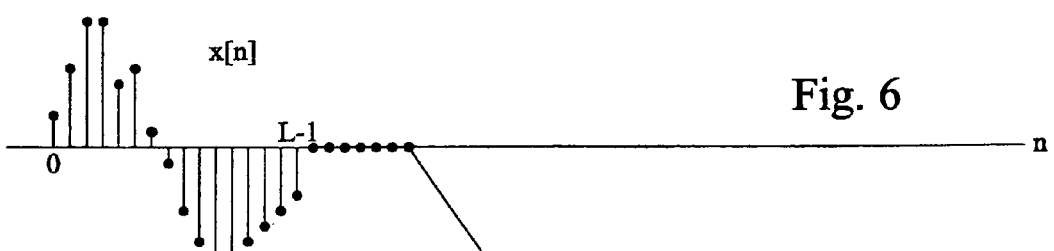
FIG. 6 is a time diagram illustrating a zero-padded sample sequence x[n]
Figure 7:
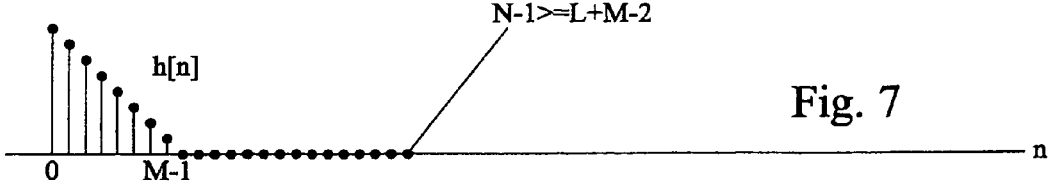
FIG. 7 is a time diagram illustrating a zero-padded filter impulse response h[n]

This method is called circular convolution. In fact this method is often preferred, since it reduces the complexity of the convolution, especially for longer filters. However, there are some problems with this approach that have to be solved:
1. Typically the input sequence x[n] and the filter sequence h[n] ore of different lengths, but the transformed sequences have to be of the same length to allow multiplication of the transforms. This problem may easily be solved by zero-padding the shorter sequence up to the length of the longer sequence before the DFT operations.
2. As noted above, the filtered sequence y[n] has a length of L+M−1 samples, while the input sequence x[n] has a length of only L samples. The first M−1 samples of this output sequence are erroneous due to so called temporal aliasing caused by a wrap around of the last M−1 samples in the output sequence (the last M−1 samples in FIG. 5 would be added to the first M−1 samples). The result is referred to as circular convolution with aliasing. However, what we want is a circular convolution that is equivalent to a linear convolution containing all L+M−1 samples of y[n]. The proper way to handle this problem is to zero-pad both x[n] and h[n] up to at least the length N=L+M−1 of y[n] before performing the DFT, as illustrated in FIGS. 6 and 7.

FIG. 8 is a time diagram of a longer sample sequence x[n]. The longer sequence may be filtered in the time domain using the definition of linear convolution in the time domain given above. Since the filter only influences a limited (M) input samples at a time, it is possible to calculate the output sample of y[n] "on the fly" as the filter h[n] is shifted through the input sequence x[n]. Thus, only the latest M samples of x[n] are required to calculate the current value of y[n]. However, if the filter is long the method is quite complex. In such cases a frequency domain method would be preferable.

In principle it would be possible to filter long sequences in the frequency domain in the way described above. However, practical considerations often make this approach unacceptable. For example, consider a sequence of speech samples in a telephony application. Typically speech is sampled at a sampling rate of 8000 samples/s. Thus, 1 second of speech will contain 8000 samples. The complexity of the necessary DFT and IDFT would be considerable for such large sequences. Another problem is that such an approach would lead to unacceptable delays, since the entire input sequence has to be collected before the DFT can be calculated. A better approach is to use block convolution in accordance with either the overlap-save or the overlap-add method. The overlap-add method will now be described with reference to FIGS. 8–14.

In accordance with the overlap-add method the long input sequence x[n] of FIG. 8 is divided into blocks of length L as illustrated by FIGS. 9–11. Each block is zero-padded up to the required length L+M−1 (where M is the filter length). Each zero-padded block is convolved with the zero-padded filter (se FIG. 7) in the frequency domain as described with reference to FIGS. 6–7. This results in the convolved blocks illustrated in FIGS. 12–14. Finally, the convolved sequences are added to form the output sequence y[n]. It is noted that in the overlap regions indicated in FIGS. 12–14 the final result is obtained by adding partial results from two block convolutions. This is the reason for the name overlap-add.

The overlap-save method is similar to the overlap-add method. However, in this case the blocks of the input sequence x[n] are overlapping (the last samples of one block are identical to the first samples of the next block). After frequency domain convolution, the erroneous first M−1 samples of each filtered block (the samples that contain temporal aliasing) are discarded before the blocks are reassembled.

In some applications the filter is determined in the frequency domain. For example, in telephony applications noise suppression based on spectral subtraction is often used (see [1, 2]). In this case the filter is determined as a function H(ω) of frequency:

$$H(\omega) = \left(1 - \delta \left(\frac{\hat{\Phi}_v(\omega)}{\hat{\Phi}_x(\omega)}\right)^\alpha\right)^\beta$$

where α, β, δ are constants and $\hat{\Phi}_v(\omega)$ and $\hat{\Phi}_x(\omega)$ are estimates of the power spectral density of the pure noise and noisy speech, respectively. This expression is obtained from the model:

x[n]=y[n]+v[n]

where v[n] is the noise signal, x[n] is the noisy speech signal and y[n] is the desired speech signal. An estimate of the desired signal y[n], in which the noise has been suppressed, is obtained by applying the filter represented by H(ω) to the noisy signal x[n].

Another example of an application in which the filter is determined in the frequency domain is a frequency selective non-linear processor for echo cancellation. In this case the filter is defined by the function:

$$H(\omega)=f(\hat{\Phi}_x(\omega),\hat{\Phi}_e(\omega))$$

where $\hat{\Phi}_x(\omega)$ represent an estimate of the power spectral density of a signal x[n] contaminated by echo and $\hat{\Phi}_e(\omega)$ represents an estimate of the power spectral density of the echo signal e[n]. The filter is based on the model:

$$x[n]=y[n]+e[n]$$

where y[n] is the desired speech signal. An estimate of the desired signal y[n], in which the echo has been cancelled, is obtained by applying the filter represented by H($\omega$) to the echo contaminated signal x[n].

In the above examples the filter is described by a real-valued continuous-frequency transfer function H($\omega$). This function is sampled to obtain a discrete-frequency transfer function H[k]. This step is typically performed when the estimates are based on parametric estimation methods. However, it is also possible to obtain the discrete-frequency transfer function H[k] directly, for example by using periodogram based estimation methods. An advantage of parametric estimation methods is that the estimates typically have lower variance than estimates from periodogram based methods.

FIG. 15 is a frequency diagram illustrating an example of a real-valued discrete-frequency filter transfer function H[k]. FIG. 16 is a time diagram of the filter impulse response h[n] that is obtained after transforming the transfer function in FIG. 15 to the time domain using an IDFT. As may be seen from FIG. 15 this filter has some unattractive features:

1. The filter has the full length N, which means that the already calculated transfer function H[k] of FIG. 15 can not be used for frequency domain convolution without causing temporal aliasing as described above.
2. If the convolution is performed in the time domain, the filter is not suitable, since its peak is split between the beginning and end of the filter h[n]. This will introduce a long algorithmic processing delay.

In accordance with the present invention both these disadvantages may be avoided. This will now be explained with reference to FIGS. 17–22.

The first step is to circularly shift the filter h[n] by N/2 samples. Mathematically this may be expressed as:

$$h[n] \rightarrow h[(n+N/2) \bmod n]$$

FIG. 17 is a time diagram of the filter impulse response of FIG. 16 after a circular shift of N/2 samples (N is assumed to be an even integer in this example).

The next step is to apply a window to the shifted filter. FIG. 18 is a time diagram illustrating an example of a time window w[n]. In this case the window is a Kaiser window (see [5]) having a length of M samples (in the example M is assumed to be an odd integer less than N). FIG. 19 is a time diagram of the filter impulse response in FIG. 17 after multiplication by the window in FIG. 18. The result is a filter u[n] with leading and trailing zeroes.

Preferably the leading zeroes are removed by another circular shift of D samples, where D is the number of leading zeroes. FIG. 20 is a time diagram of the filter impulse response of FIG. 19 after a circular shift to remove leading zeroes. The resulting filter f[n] will have its first non-zero tap at n=0 and will have N–M trailing zeroes.

The result of the steps performed in FIGS. 17–20 is illustrated in FIGS. 21–22. FIG. 21 is a frequency diagram of the magnitude of the filter transfer function F[k] that is obtained after transforming the filter impulse response f[n] of FIG. 20 to the frequency domain. FIG. 22 is a corresponding frequency diagram of the phase of the filter transfer function F[k]. As may be seen from these figures the real-valued filter H[k] has been transformed into a linear phase filter F[k] (actually linear phase is obtained already after the first circular shift in FIG. 17).

It is noted that the transformed filter f[n] in FIG. 20 has an effective length of only M taps, and that the remaining N–M taps are zero. This fact may be exploited in two ways:

1. The zeroes may be used to implement linear convolution in the frequency domain by using circular convolution of blocks of length L in combination with the overlap-add method (FIGS. 8–14) or the overlap-save method. The block length L is obtained as:

$$L \leq N-M+1$$

2. The convolution may be performed in the time domain if the filter length M is selected sufficiently small.

The GSM system will now be considered as an example of this procedure. This system already has a natural block length for block convolution, since speech is divided into frames of 160 samples. Thus, a natural choice is a convolution block length L of 160 samples. This leads to a natural FFT length N of 256 samples. This results in a maximum filter length M of 97 samples (M<=N–L+1).

For a convolution block length of 256 samples the filter length typically lies in the interval 20–97 filter taps. For a Kaiser window the parameter $\beta$ typically lies in the interval 2–5. Experiments have shown that a filter length M of 55 samples obtained from a Kaiser window having a length of 55 samples and a parameter $\beta \approx 3$ is a good choice, which even allows implementation of the convolution in the time domain using a signal processor.

FIG. 20 illustrates that the linear phase filter f[n] is symmetric around the peak at (M–1)/2. This will lead to an algorithmic delay P of half the filter length. This algorithmic delay may be reduced by transforming the filter f[n] to a minimum phase filter. A minimum phase filter may be obtained from the linear phase filter in FIG. 20 by using the method described in [6]. Briefly, this method starts with the expression:

$$f(z) = \sum_{k=-n}^{n} f[k] z^k$$

where f[k] are the taps of a linear phase filter that is re-centered (linearly shifted) so that it is symmetric around tap 0 instead of tap (M–1)/2 as in FIG. 20. According to the spectral factorization lemma f(z) may also be written as:

$$f(z)=Cg(z)g(z^{-1})$$

where C is a constant and g(z) is a polynomial $$g(z)=z^n+g_1 z^{n-1}+ \ldots +g_n$$

having all zeroes inside the unit circle. If g(z) is determined, a minimum phase filter with the same magnitude response in the frequency domain as the linear phase filter may be obtained as:

$$Cg(z)g(z)$$

Several methods exist for determining the coefficients of g(z) from the coefficients of f(z). For example, g(z) may be determined by solving the non-linear system of equations:

$$\begin{pmatrix} f_0 \\ f_1 \\ \vdots \\ f_n \end{pmatrix} = \begin{pmatrix} g_0 & g_1 & \cdots & g_n \\ 0 & g_0 & \cdots & g_{n-1} \\ \vdots & \vdots & \vdots & \vdots \\ 0 & 0 & \cdots & g_0 \end{pmatrix} \begin{pmatrix} g_0 \\ g_1 \\ \vdots \\ g_n \end{pmatrix}$$

using the Newton-Rapson algorithm. Applying the spectral factorization lemma to the linear phase filter in FIG. 20 results in a minimum phase filter with the same magnitude response (FIG. 21) in the frequency domain. In the time domain the algorithmic delay P in FIG. 22 has been reduced, as illustrated in FIG. 23.

In the above description of FIGS. 15–23 a certain processing order has been assumed. For example, the circular shift in FIG. 17 was performed before the windowing in FIG. 19. However, this order may be reversed if the window is circularly shifted accordingly. Furthermore, the circular shift in FIG. 20 may be eliminated by including it in the circular shift in FIG. 17 and circularly shifting the window accordingly.

In this description a Kaiser window was used. However, all the common window types, such as Hamming, Hanning, Barlett windows etc. are feasible. Even a rectangular window may be used.

Figure 24:
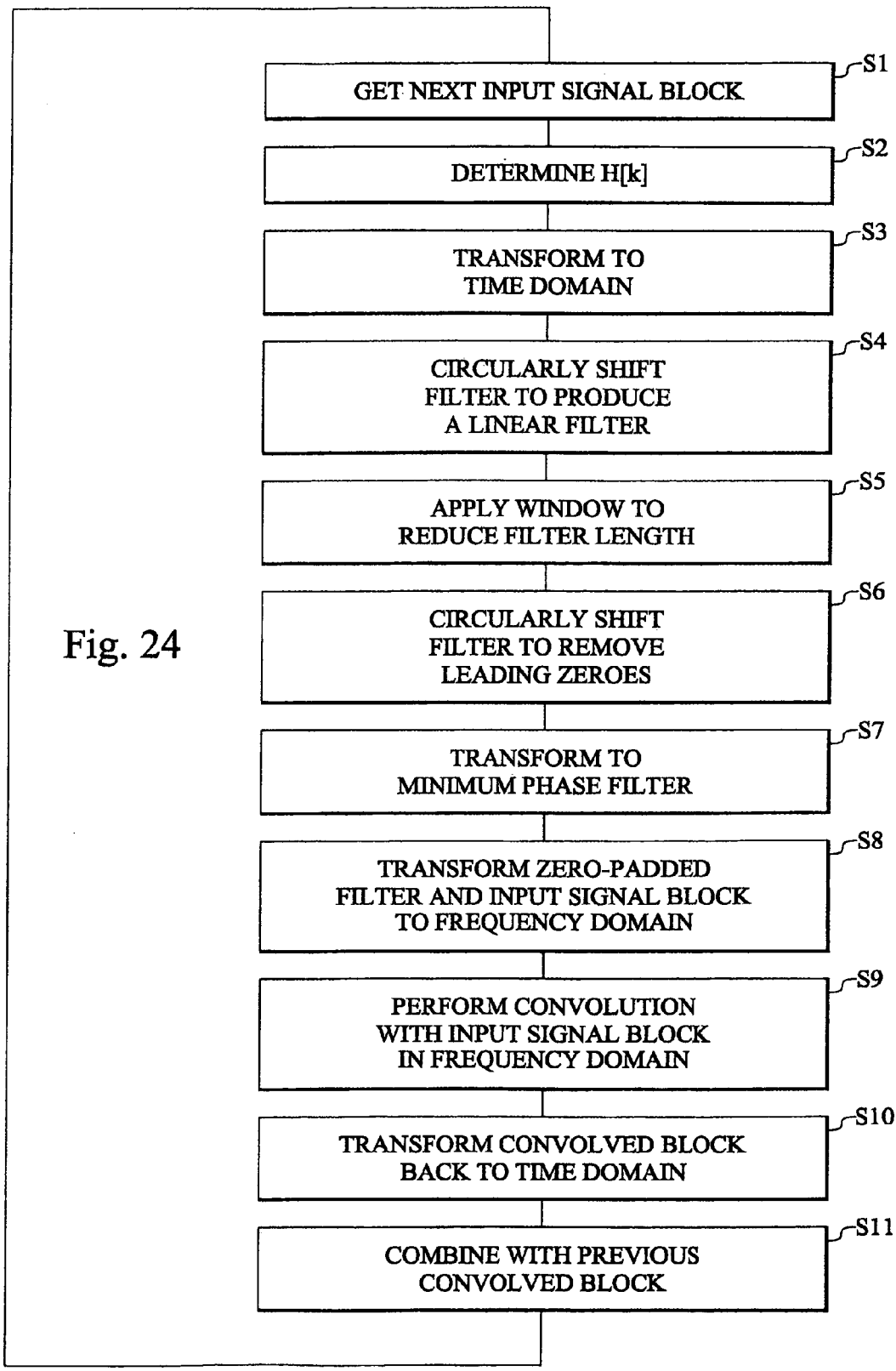
FIG. 24 is a flow chart of an exemplary embodiment of the convolution method in accordance with the present invention.

FIG. 24 is a flow chart of an exemplary embodiment of the convolution method in accordance with the present invention. This embodiment relates to noise suppression and uses frequency domain convolution based on the overlap-add method and minimum phase filtering. Step S1 collects the next input signal block. Using this block step S2 determines the transfer function H[k] from the above described noise suppression algorithm. Step S3 transforms H[k] to the time domain using the IFFT. Step S4 circularly shifts the time domain representation of the filter N/2 samples to produce a linear phase filter. Step S5 applies a window to the linear phase filter to reduce its length. Step S6 performs another circular shift to remove leading zeroes created by the window. Step S7 transforms the resulting reduced length linear phase filter into a minimum phase filter. Step S8 transforms the already zero-padded filter and the zero-padded input signal block to the frequency domain using the FFT. Step S9 multiplies the filter transform with the signal block transform to perform the convolution. Step S10 transforms the result back to the time domain using the IFFT. Step S11 combines the current convolved block with the previous block in accordance with FIGS. 12–14. Thereafter the algorithm returns to step S1 to collect the next input signal block and repeat the procedure.

If the convolution is performed in the time domain, steps S8–S11 are replaced by a time domain convolution step.

Figure 25:
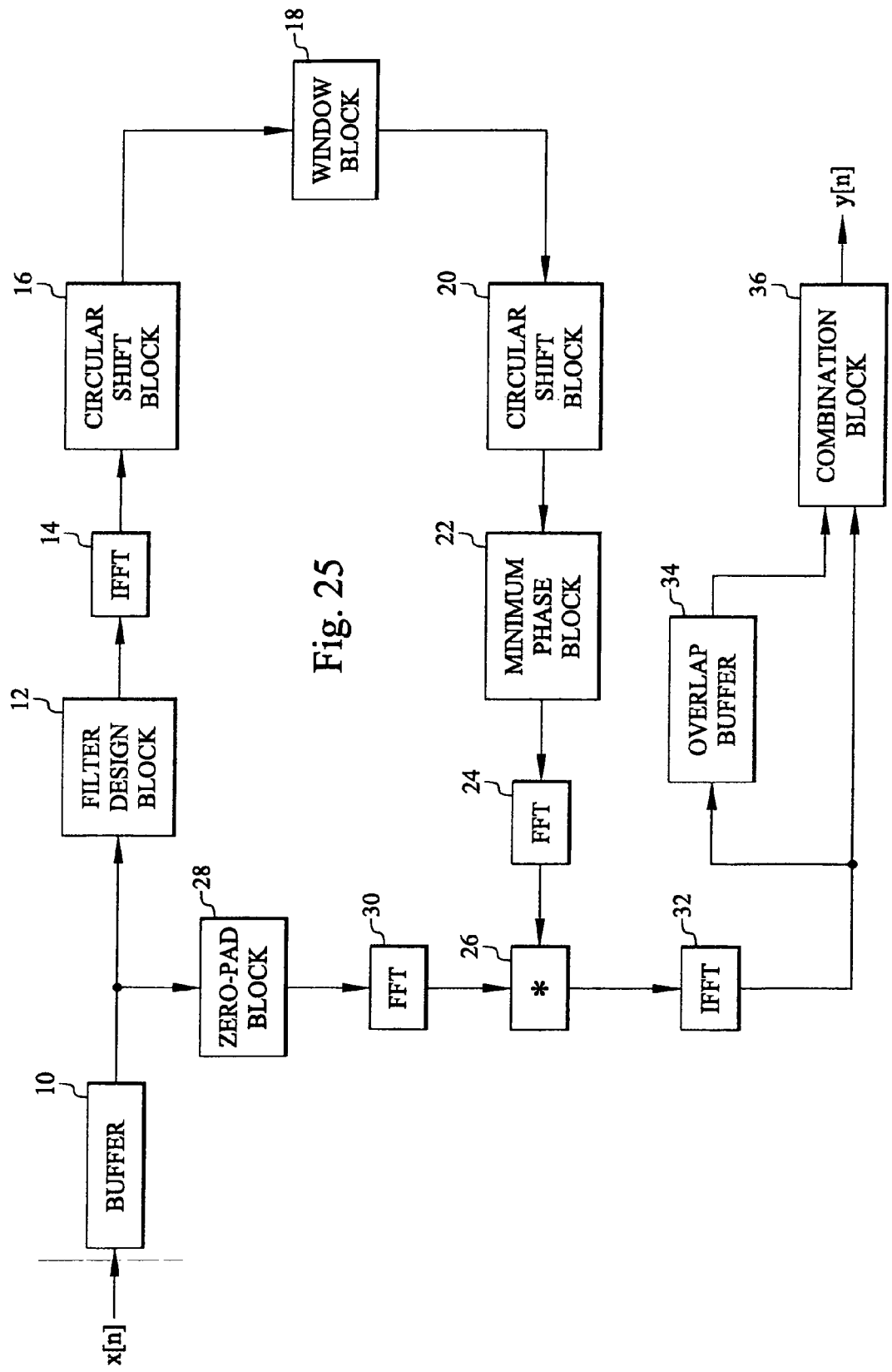
FIG. 25 is a block diagram of an exemplary embodiment of a convolution apparatus in accordance with the present invention.

FIG. 25 is a block diagram of an exemplary embodiment of a convolution apparatus in accordance with the present invention. This embodiment is suitable for performing the method described in FIG. 24. An input signal x[n] is forwarded to a buffer 10, which collects and stores a signal block. Using the input signal block a filter design block calculates the noise suppression filter H[k]. An IFFT block 14 transforms the filter to the time domain. A circular shift block 26 circularly shifts the time representation of the filter by N/2 samples. A window block 18 applies a window to the shifted filter. Another circular shift block 20 removes leading zeroes from the reduced length filter. A minimum phase block 22 transforms the filter into a minimum phase filter. An FFT block transforms the filter back to the frequency domain. The transform is forwarded to a multiplication block 26. The input signal block from buffer 10 is also forwarded to a zero-pad block 20, which pads zeroes to the block up to the length of L+M−1. The zero-padded block is transformed to the frequency domain by an FFT block 30. The transform is forwarded to the other input of multiplication block 26. The convolved signal block from multiplication block 30 is transformed back to the time domain in an IFFT block 32. The time representation of the convolved block is forwarded to an overlap buffer 34 and to a combination block 36. Overlap buffer 34 extracts the overlap part (the last part) of the received signal block and outputs the stored overlap part of the previous convolved signal block. Combination block 36 adds the overlap part of the previous block to the beginning of the current block and outputs the remaining part of the current block unchanged. The result is the convolved signal y[n].

Typically the blocks in FIG. 25 are implemented by one or several microprocessors or micro/signal processor combinations.

If the convolution is performed in the time domain, blocks 24–36 are replaced by a time domain convolution block.

Rather than repeating the above description, it is noted that a digital filter design apparatus in accordance with an exemplary embodiment of the present invention will include blocks 10–22 in FIG. 25.

It will be understood by those skilled in the art that various modifications and changes may be made to the present invention without departure from the scope thereof, which is defined by the appended claims.

What is claimed is:

1. A method of designing a digital filter, including the steps of:
    first, determining a real-valued discrete-frequency representation of a desired full length digital filter;
    second, transforming said real-valued discrete-frequency representation into a corresponding discrete-time representation;
    third, circularly shifting said corresponding discrete-time representation; and
    fourth, applying a shortening window to said circularly-shifted corresponding discrete-time representation to produce a zero-padded reduced length filter.

2. The method of claim 1, further including the step of circularly shifting said zero-padded reduced length filter to remove leading zeroes.

3. The method of claim 1, wherein said real-valued discrete-frequency representation is formed by a noise suppressing spectral subtraction algorithm.

4. The method of claim 1, wherein said real-valued discrete-frequency representation is formed by a frequency selective non-linear algorithm for echo cancellation.

5. The method of claim 1, wherein said shortening window is a Kaiser window.

6. The method of claim 1, further including the step of transforming said zero-padded reduced length filter into a minimum phase filter.

7. A digital convolution method, including the steps of:
    first, determining a real-valued discrete-frequency representation of a desired full length digital filter;
    second, transforming said real-valued discrete-frequency representation into a corresponding discrete-time representation;

third, circularly shifting said corresponding discrete-time representation;

fourth, applying a shortening window to said circularly-shifted corresponding discrete-time representation to produce a zero-padded reduced length filter; and fifth, convolving an input signal with said zero-padded reduced length filter.

8. The method of claim 7, further including the step of circularly shifting said zero-padded reduced length filter to remove leading zeroes.

9. The method of claim 7, further including the step of transforming said zero-padded reduced length filter into a minimum phase filter.

10. The method of claim 7, wherein the step of convolving includes the step of performing a convolution in the time domain using the corresponding discrete-time representation of said zero-padded reduced length filter.

11. The method of claim 7, wherein the step of convolving includes the step of performing a convolution in the frequency domain by using an overlap-add method.

12. The method of claim 7, wherein the step of convolving includes the step of performing a convolution in the frequency domain by using an overlap-save method.

13. A digital filter design apparatus, including:
means for determining a real-valued discrete-frequency representation of a desired full length digital filter;
means, coupled to the output of said means for determining a real-valued discrete-frequency representation, for transforming said real-valued discrete-frequency representation into a corresponding discrete-time representation;
means, coupled to the output of said means for transforming said real-valued discrete-frequency representation, for circularly shifting said corresponding discrete-time representation; and
means, coupled to the output of said means for circularly shifting said discrete-time representation, for applying a shortening window to said circularly-shifted corresponding discrete-time representation to produce a zero-padded reduced length filter.

14. The apparatus of claim 13, further including means for circularly shifting said zero-padded reduced length filter to remove leading zeroes.

15. The apparatus of claim 13, wherein the shortening window applying means implements a Kaiser window.

16. The apparatus of claim 13, further including means for transforming said zero-padded reduced length filter into a minimum phase filter.

17. A digital convolution apparatus, including:
means for determining a real-valued discrete-frequency representation of a desired full length digital filter;
means, coupled to the output of said means for determining a real-valued discrete-frequency representation, for transforming said real-valued discrete-frequency representation into a corresponding discrete-time representation;
means, coupled to the output of said means for transforming said real-valued discrete-frequency representation, for circularly shifting said corresponding discrete-time representation;
means, coupled to the output of said means for circularly shifting said discrete-time representation, for applying a shortening window to said circularly-shifted corresponding discrete-time representation to produce a zero-padded reduced length filter; and
means, coupled to the output of said means for applying a shortening window to said circularly-shifted corresponding discrete-time representation, for convolving an input signal with said zero-padded reduced length filter.

18. The apparatus of claim 17, further including means for circularly shifting said zero-padded reduced length filter to remove leading zeroes.

19. The apparatus of claim 17, further including means for transforming said zero-padded reduced length filter into a minimum phase filter.

20. The apparatus of claim 17, further including means for performing the convolution in the time domain using the corresponding discrete-time representation of said zero-padded reduced length filter.

21. The apparatus of claim 17, wherein said means for convolving comprises means for performing a convolution of said input signal in the frequency domain by using an overlap-add method.

22. The method of claim 17, wherein said means for convolving comprises means for performing a convolution of said input signal in the frequency domain by using an overlap-save method.

* * * * *